(12) United States Patent
Teranishi

(10) Patent No.: US 9,019,594 B2
(45) Date of Patent: Apr. 28, 2015

(54) CONTROL METHOD AND MEASURING METHOD OF SEMICONDUCTOR OPTICAL AMPLIFIER, AND SEMICONDUCTOR OPTICAL AMPLIFIER DEVICE

(71) Applicant: Sumitomo Electric Device Innovations, Inc., Yokohama-shi, Kanagawa (JP)

(72) Inventor: Ryota Teranishi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 222 days.

(21) Appl. No.: 13/724,634

(22) Filed: Dec. 21, 2012

(65) Prior Publication Data

US 2013/0170019 A1 Jul. 4, 2013

(30) Foreign Application Priority Data

Dec. 21, 2011 (JP) ................................. 2011-280145
Nov. 27, 2012 (JP) ................................. 2012-258344

(51) Int. Cl.
| | |
|---|---|
| H01S 5/068 | (2006.01) |
| H01S 5/50 | (2006.01) |
| H01S 5/40 | (2006.01) |
| H01S 5/0683 | (2006.01) |
| H01S 5/00 | (2006.01) |
| H01S 5/024 | (2006.01) |
| H01S 5/06 | (2006.01) |
| H01S 5/343 | (2006.01) |
| B82Y 20/00 | (2011.01) |

(52) U.S. Cl.
CPC ........... *H01S 5/06812* (2013.01); *H01S 5/0683* (2013.01); *H01S 5/06804* (2013.01); *H01S 5/0085* (2013.01); *H01S 5/02415* (2013.01); *H01S 5/02438* (2013.01); *H01S 5/0617* (2013.01); *H01S 5/34306* (2013.01); *H01S 5/4006* (2013.01); *H01S 5/5063* (2013.01); *B82Y 20/00* (2013.01)

(58) Field of Classification Search
CPC ... H01S 5/06251; H01S 5/0265; H01S 5/026; H01S 5/06812
USPC ......................................................... 359/344
See application file for complete search history.

(56) References Cited

U.S. PATENT DOCUMENTS

| | | | | |
|---|---|---|---|---|
| 4,344,173 | A * | 8/1982 | Straus | 372/29.011 |
| 4,563,765 | A * | 1/1986 | Tsang et al. | 372/50.22 |
| 5,023,878 | A * | 6/1991 | Berthold et al. | 372/20 |
| 5,027,362 | A * | 6/1991 | Hokanson et al. | 372/38.01 |
| 5,392,308 | A * | 2/1995 | Welch et al. | 372/92 |
| 5,536,934 | A * | 7/1996 | Hayashi | 250/214.1 |
| 5,828,679 | A * | 10/1998 | Fisher | 372/6 |
| 6,195,371 | B1 * | 2/2001 | Haneda et al. | 372/29.01 |
| 6,310,720 | B1 * | 10/2001 | Walker et al. | 359/344 |
| 6,462,865 | B1 * | 10/2002 | Chu et al. | 359/344 |

(Continued)

FOREIGN PATENT DOCUMENTS

JP 2003-348021 A 12/2003

*Primary Examiner* — Ari M Diacou
(74) *Attorney, Agent, or Firm* — Westerman, Hattori, Daniels & Adrian, LLP

(57) ABSTRACT

A control method of a semiconductor optical amplifier includes: controlling a driving current of the semiconductor optical amplifier in a region where a light output intensity decreases in accordance with increasing of the driving current, a drive current in the region being higher than a drive current in a region where a light output intensity increases in accordance with increasing of the driving current.

17 Claims, 7 Drawing Sheets

(56) References Cited

U.S. PATENT DOCUMENTS

| | | |
|---|---|---|
| 6,526,083 B1* | 2/2003 | Kneissl et al. ............ 372/50.22 |
| 2002/0003650 A1* | 1/2002 | Usami et al. ................. 359/248 |
| 2003/0095737 A1* | 5/2003 | Welch et al. .................... 385/14 |
| 2003/0223763 A1 | 12/2003 | Tanaka |
| 2004/0091009 A1* | 5/2004 | Matsuda et al. ................ 372/43 |
| 2005/0008048 A1* | 1/2005 | McInerney et al. ............ 372/25 |
| 2008/0056313 A1* | 3/2008 | Yamazaki ....................... 372/28 |
| 2009/0016394 A1* | 1/2009 | Kanno ...................... 372/38.02 |
| 2011/0026923 A1* | 2/2011 | Kim et al. ....................... 398/79 |

\* cited by examiner

DRIVE CURRENT: 140 mA

DRIVE CURRENT: 150 mA

DRIVE CURRENT: 160 mA

DRIVE CURRENT: 180 mA

DRIVE CURRENT: 200 mA

DRIVE CURRENT: 140 mA

DRIVE CURRENT: 150 mA

DRIVE CURRENT: 160 mA

DRIVE CURRENT: 180 mA

DRIVE CURRENT: 200 mA

CONTROL METHOD AND MEASURING METHOD OF SEMICONDUCTOR OPTICAL AMPLIFIER, AND SEMICONDUCTOR OPTICAL AMPLIFIER DEVICE

CROSS-REFERENCE TO RELATED APPLICATION

This application is based upon and claims the benefit of priority of the prior Japanese Patent Application Nos. 2011-280145 and 2012-258344, filed on Dec. 21, 2011 and November 27, 2012, respectively, the entire contents of which are incorporated herein by reference.

BACKGROUND (i) Technical Field

The present invention relates to a control method and a measuring method of a semiconductor optical amplifier, and a semiconductor optical amplifier device.

(ii) Related Art

There has been known a laser module including a semiconductor optical amplifier (SOA) and a semiconductor laser as disclosed in Japanese Patent Application Publication No. 2003-348021.

SUMMARY

It is an object to provide a control method and a measuring method of a semiconductor optical amplifier, and a semiconductor optical amplifier device that are capable of obtaining a good optical waveform.

According to an aspect of the present invention, there is provided a control method of a semiconductor optical amplifier including: controlling a driving current of the semiconductor optical amplifier in a region where a light output intensity decreases in accordance with increasing of the driving current, a drive current in the region being higher than a drive current in a region where a light output intensity increases in accordance with increasing of the driving current.

According to another aspect of the present invention, there is provided a semiconductor optical amplifier device including: a semiconductor optical amplifier; and a controller that controls a driving current of the semiconductor optical amplifier by a region where a light output intensity decreases in accordance with increasing of the driving current, a drive current in the region being higher than a drive current in a region where a light output intensity increases in accordance with increasing of the driving current.

According to another aspect of the present invention, there is provided a measuring method of a semiconductor optical amplifier including: first step of setting a temperature of the semiconductor optical amplifier to a first value; second step of measuring a light output intensity of the semiconductor optical amplifier under controlling a driving current of the semiconductor optical amplifier in a region where a light output intensity decreases in accordance with increasing of the driving current, a drive current in the region being higher than a drive current in a region where a light output intensity increases in accordance with increasing of the driving current; third step of setting the temperature to a second value different from the first value; and fourth step of measuring a light output intensity of the semiconductor optical amplifier under controlling a driving current of the semiconductor optical amplifier in a region where a light output intensity decreases in accordance with increasing of the driving current, a drive current in the region being higher than a region where a light output intensity increases in accordance with increasing of the driving current.

DETAILED DESCRIPTION

A light beam emitted from a laser module is transmitted through, for example, an optical fiber. Such emitted light beam is desired to keep a good optical waveform not only immediately after the emission from the laser module, but also after the transmission through the optical fiber.

Hereinafter, a description will be given of embodiments of the present invention.

[First Embodiment]

Figure 1:
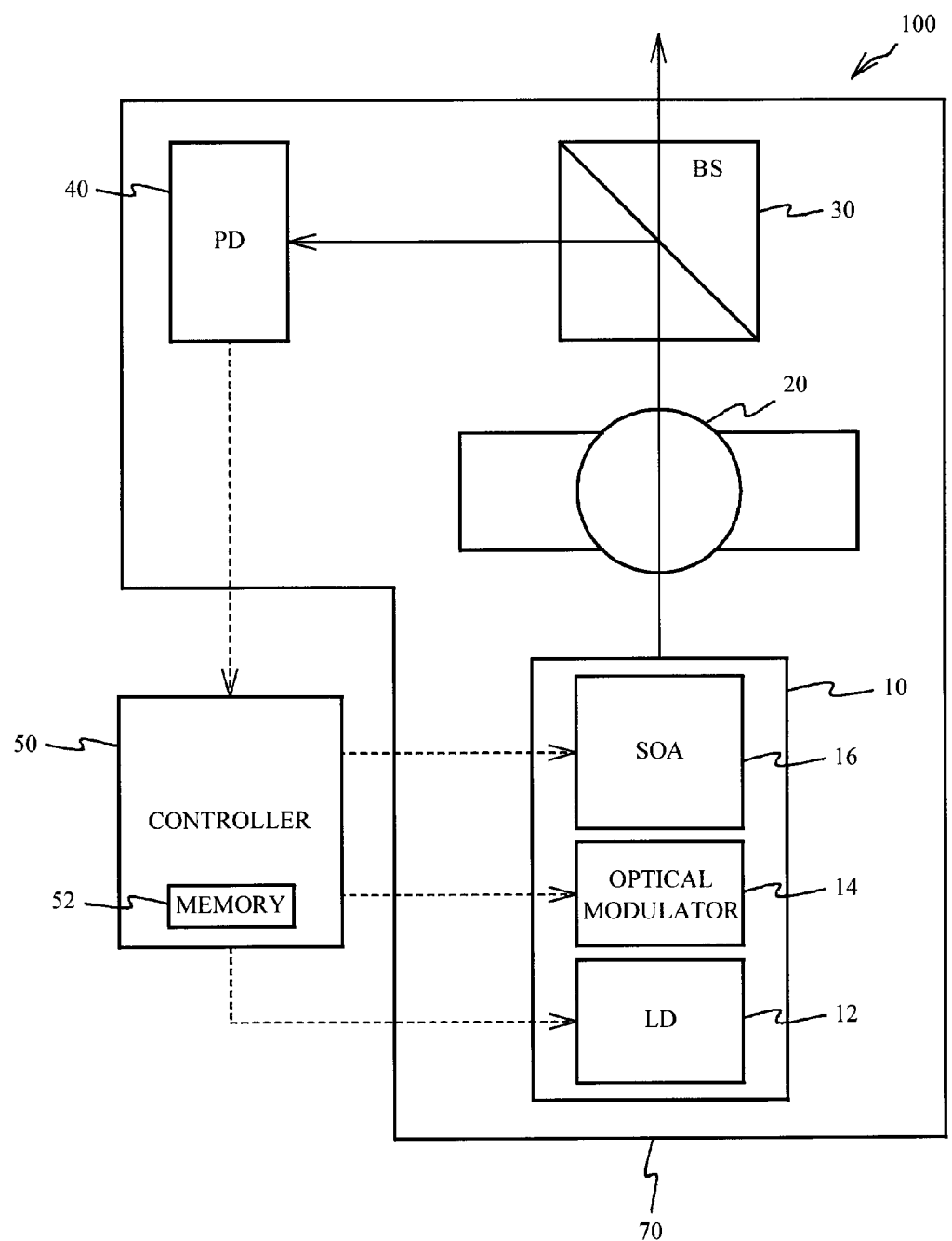
FIG. 1 is a schematic view for explaining a configuration of a semiconductor optical amplifier device in accordance with a first embodiment.

FIG. 1 is a schematic view illustrating a configuration of a semiconductor optical amplifier device 100 in accordance with a first embodiment. As illustrated in FIG. 1, the semiconductor optical amplifier device 100 includes a laser chip 10, a lens 20, a beam splitter 30, a photo diode 40, a TEC (Thermoelectric Coolers) 70, and a controller 50.

The laser chip 10 has a structure including a semiconductor laser 12, an optical modulator 14, and a semiconductor optical amplifier 16 that are integrated on, for example, an InP substrate. The semiconductor optical amplifier 16 has a structure including an n-type InP clad layer, an active layer (multiple quantum well structure composed of InGaAsP well/InGaAsP barrier), and a p-type InP clad layer that are stacked in this order. The optical modulator 14 and the semiconductor optical amplifier 16 are integrated in this order at a front side of the semiconductor laser 12. The optical modulator 14 is an electroabsorption modulator for example, and emits a modulated light beam by modulating a CW light beam emitted from the semiconductor laser 12 that is a light source. The optical modulator 14 intensity-modulates a CW light beam for example. The semiconductor optical amplifier 16 amplifies the modulated light beam emitted from the optical modulator 14. This allows the laser chip 10 to emit a high-power modulated light beam. In the first embodiment, the semiconductor laser 12, the optical modulator 14, and the semiconductor optical amplifier 16 are integrated on a single substrate to form the laser chip 10, but the semiconductor laser 12, the optical modulator 14, and the semiconductor optical amplifier 16 may be separate optical components. In addition, the active layer of the semiconductor optical amplifier 16 may be a bulk semiconductor layer made of InGaAsP. The semiconductor optical amplifier 16 can amplify optical signals within a band of wavelength used for communication (e.g. 1250 nm to 1600 nm).

The lens 20 is a lens for collimation, and is located at the front side of the laser chip 10. The beam splitter 30 is located in front of the lens 20. The beam splitter 30 splits an optical signal emitted from the laser chip 10 into two optical signals. A first split light beam emitted from the beam splitter 30 is emitted into, for example, an optical fiber (not illustrated) as an output signal, and transmitted through the optical fiber. A second split light beam emitted from the beam splitter 30 is received by the photo diode 40. The photo diode 40 is an element that converts incident light into a current signal, and is located so as to receive the second split light beam emitted from the beam splitter 30. The TEC 70 is located under the laser chip 10, the lens 20, the beam splitter 30, and the photo diode 40, and controls a temperature of the semiconductor optical amplifier 16.

The controller 50 includes a CPU (Central Processing Unit), and a memory 52 including a RAM (Random Access Memory), a ROM (Read Only Memory), and a rewritable nonvolatile memory (e.g. flash memory). The controller 50 controls the semiconductor laser 12, the optical modulator 14, and the semiconductor optical amplifier 16 by inputting electrical signals thereto. In addition, the controller 50 receives a current (monitoring value) that the photo diode 40 outputs by photoelectric conversion. The controller 50 feedback-controls the semiconductor laser 12 based on the monitoring value from the photo diode 40.

Figure 2:
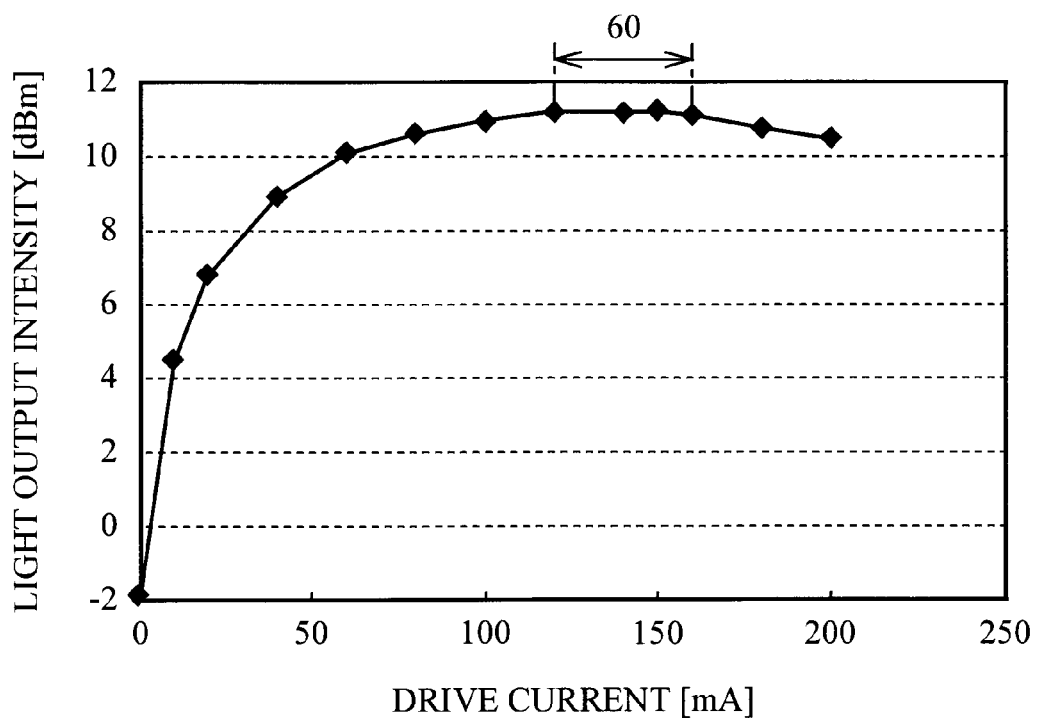
FIG. 2 is a diagram illustrating a relationship between drive current and light output intensity.

Disclosed herein are output characteristics of the semiconductor optical amplifier 16. FIG. 2 is a diagram illustrating a relationship between drive current and light output intensity. The semiconductor optical amplifier 16 is assumed to receive an intensity-modulated light beam that has been modulated to have a given intensity. At this time, the light output intensity of the intensity-modulated light beam is constant. In FIG. 2, the horizontal axis represents a drive current flowing into the semiconductor optical amplifier 16, and the vertical axis represents an average light output intensity of the intensity-modulated light beam emitted from the semiconductor optical amplifier 16. As illustrated in FIG. 2, the light output intensity increases as the drive current increases. However, the light output intensity does not increase to infinity, and reaches saturation at a given drive current. Hereinafter, a region in which the light output intensity little changes even though the drive current increases is referred to as a saturated region 60 in which the light output intensity reaches saturation. The light output intensity in the saturated region 60 does not always maintain a constant value because of measurement error and the like. Thus, for example, since the light output intensity little changes even though the drive current increases in a region between a maximum value of the light output intensity and the light output intensity that is 0.1 dB smaller than the maximum value, the region can be determined as the saturated region 60. Therefore, in the first embodiment, since the light output intensity has a maximum value of 11.2 dBm at a drive current of 150 mA, a region between 11.1 dBm, which is 0.1 dB smaller than the maximum value, and 11.2 dBm can be determined as the saturated region 60. When the drive current is increased to exceed the saturated region 60, the light output intensity decreases. Such decrease of the light output intensity is considered to be due to reduction in luminance efficiency by the heat generation of the semiconductor optical amplifier 16 caused by excess current injection.

As described above, the output characteristics of the semiconductor optical amplifier 16 include a region in which the light output intensity increases with increase in drive current, the saturated region 60 in which the drive current is higher than that in the region where the light output intensity increases and the light output intensity reaches saturation, and a region in which the drive current is higher than that in the saturated region 60 and the light output intensity decreases. Width of the saturated region 60 may vary in accordance with structure or materials of the semiconductor optical amplifier 16. In a case where the width of the saturated region 60 is small, a peak is observed instead of the saturated region 60.

The semiconductor optical amplifier is commonly desired to be driven so as to amplify incident light efficiently. That is to say, the semiconductor optical amplifier is desired to be driven so as to consume lower electrical power consumption and obtain higher optical output. A conventional method drives a semiconductor optical amplifier in a region in which the light output intensity has yet to reach saturation to achieve lower electrical power consumption and higher optical output. In other words, the semiconductor optical amplifier is not driven in a region after saturation (or peaking) from the viewpoint of electrical power consumption and amplification factor.

A description will now be given of an investigation of optical waveforms conducted by the inventor. The inventor investigated the optical waveforms by consciously increasing the drive current flowing into the semiconductor optical amplifier 16 to the drive current in the region in which the drive current exceeds the saturated region 60 and the light output intensity decreases in the semiconductor optical amplifier device 100 illustrated in FIG. 1. More specifically, the optical waveform of an output signal just after a split by the beam splitter 30 and the optical waveform of the output signal that has been 20-km transmitted through the optical fiber were measured by changing the drive current flowing into the semiconductor optical amplifier 16 to 140 mA, 150 mA, 160 mA, 180 mA, and 200 mA. The semiconductor laser 12 was set to have a constant drive current of 150 mA, and the optical modulator 14 was set to have a constant voltage of 2 V.

Figure 3A:
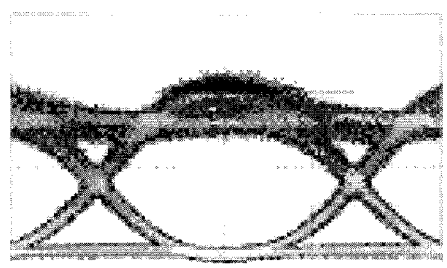
FIG. 3A-3E are diagrams illustrating an optical waveform of a light beam right after a split by a beam splitter.
Figure 3B:
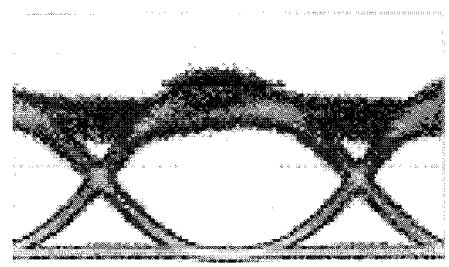
Figure 3C:
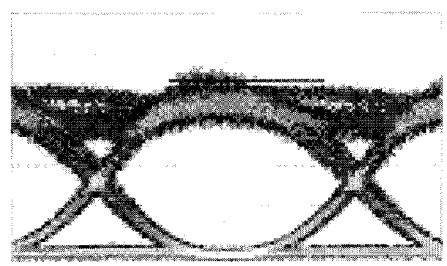
Figure 3D:
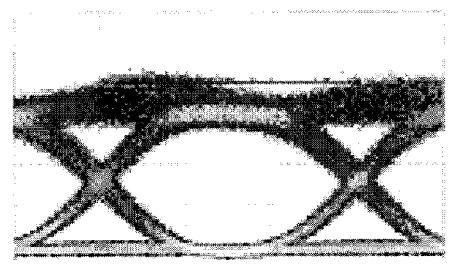
Figure 3E:
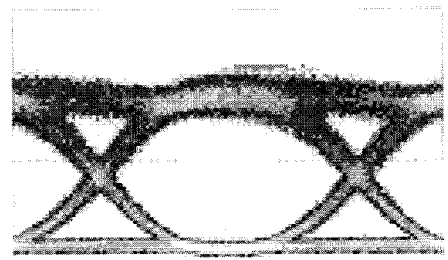

FIG. 3A through FIG. 3E are diagrams illustrating optical waveforms of output signals just after a split by the beam splitter 30. The illustrated optical waveforms are called an eye-pattern, and are formed by overlapping signal waveforms. The signal waveforms overlapping each other in the same conditions form a clear eye-pattern, and are assumed to have good characteristics. FIG. 3A illustrates an optical waveform at a drive current of 140 mA, FIG. 3B illustrates at 150 mA, FIG. 3C illustrates at 160 mA, FIG. 3D illustrates at 180 mA, and FIG. 3E illustrates at 200 mA. As illustrated in FIG. 3A through FIG. 3E, regardless of the value of the drive current, the output signal just after a split by the beam splitter 30 has a good optical waveform. That is to say, the signal that has yet to be transmitted through the optical fiber has a good optical waveform.

Figure 4A:
FIG. 4A-4E are diagrams illustrating an optical waveform of a beam light that has been transmitted through an optical fiber.
Figure 4B:
Figure 4C:
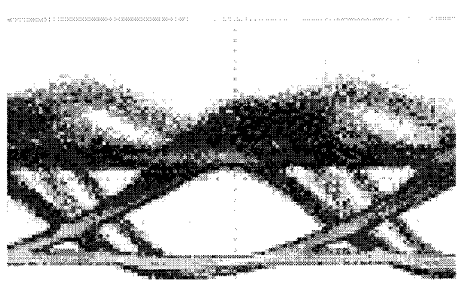
Figure 4D:
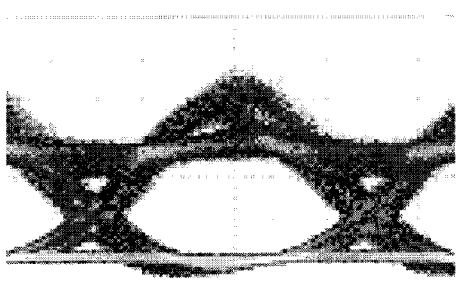
Figure 4E:
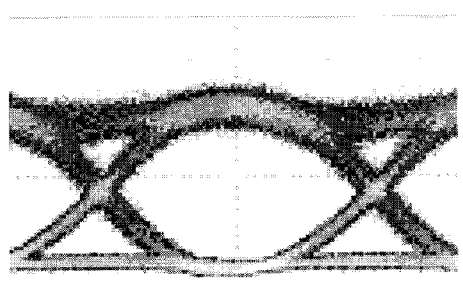

FIG. 4A through FIG. 4E are diagrams illustrating the optical waveform of the output signal that has transmitted through the optical fiber. FIG. 4A illustrates an optical waveform at a drive current of 140 mA, FIG. 4B illustrates at 150 mA, FIG. 4C illustrates at 160 mA, FIG. 4D illustrates at 180 mA, and FIG. 4E illustrates at 200 mA. As illustrated in FIG. 4A through FIG. 4E, when the drive current is 140 mA, 150 mA, or 160 mA, the eye-pattern is deformed and the waveform degrades. On the other hand, when the drive current is 180 mA or 200 mA, the eye-pattern keeps its shape. The clear eye-pattern is exhibited especially when the drive current is 200 mA.

The drive currents 180 mA and 200 mA, at which the output signal that has been transmitted through the optical fiber has a good optical waveform, are in the region in which the drive current is higher than the drive current in the saturated region 60 in which the light output intensity reaches saturation as illustrated in FIG. 2. The reason why even the output signal that has been transmitted through the optical fiber has a good optical waveform by inputting the drive current higher than that in the saturated region 60 to the semiconductor optical amplifier 16 is considered as follows. That is to say, the further increase of the drive current in the saturated region 60 causes increase in amount of negative chirp inside the semiconductor optical amplifier 16. Therefore, when the drive current is increased to the region in which the drive current is higher than the drive current in the saturated region 60, the amount of negative chirp inside the semiconductor optical amplifier 16 further increases, and the significant negative chirp is consequently applied to the output signal light beam. This suppresses the effect of wavelength dispersion in the transmission through the optical fiber, and makes the optical waveform good even after the transmission through the optical fiber.

As described above, the inventor has discovered that a good optical waveform is obtained before and after the transmission through the optical fiber by driving the semiconductor optical amplifier consciously in the region in which the drive current is higher than that in the saturated region, i.e. in the region in which the drive current exceeds the saturated region and the light output intensity decreases. In addition to the case described in the first embodiment, this may be applicable to a semiconductor optical amplifier used for relaying an optical transmission. However, the further advantageous effect is discovered in the semiconductor optical amplifier device 100 including the semiconductor laser 12, the optical modulator 14, and the semiconductor optical amplifier 16 as described in the first embodiment. This is because the optical waveform of the output signal that has been transmitted through the optical fiber further deteriorates in the semiconductor optical amplifier device 100 designed to directly input the high-power light beam emitted from the semiconductor laser 12 (optical modulator 14) to the semiconductor optical amplifier 16 as described in the first embodiment, and the advantageous effect appears more significantly.

Figure 5:
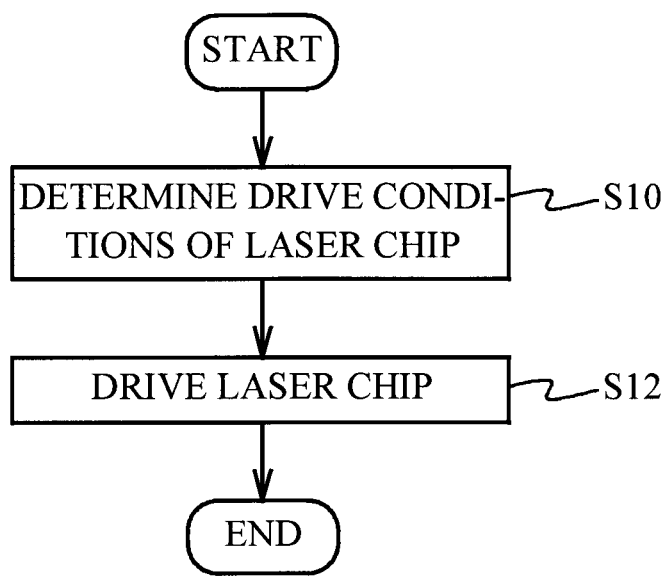
FIG. 5 is a flowchart for explaining control of the semiconductor optical amplifier device.

FIG. 5 is a flowchart for explaining control of the semiconductor optical amplifier device 100. The controller 50 first determines driving conditions of the laser chip 10 (step S10). The driving conditions include a drive current of the semiconductor laser 12, a drive signal to the optical modulator 14, and a drive current of the semiconductor optical amplifier 16. Here, the ROM of the controller 50 preliminarily stores a current in the region in which the drive current is higher than the drive current in the saturated region 60 for the drive current of the semiconductor optical amplifier 16. Therefore, the controller 50 determines the drive conditions of the semiconductor optical amplifier 16 by reading out the drive current stored in the ROM.

Then, the controller 50 drives the laser chip 10 with the drive conditions determined in step S10 (step S12). That is to say, the controller 50 injects the drive current into the semiconductor optical amplifier 16 in the region in which the drive current exceeds the saturated region 60 and the light output intensity decreases. This process allows the semiconductor optical amplifier 16 to drive in the region in which the drive current is higher than the drive current in the saturated region 60.

As described above, the first embodiment drives the semiconductor optical amplifier 16 in the region in which the drive current exceeds the saturated region 60, in which the light output intensity reaches saturation, and the optical output intensity decreases. That is to say, the semiconductor optical amplifier 16 is driven in a region where a light output intensity decreases in accordance with increasing of the driving current, a drive current of the region being higher than a region where a light output intensity increases in accordance with increasing of the driving current. This enables to obtain good optical waveforms not only before but also after the transmission through the optical fiber as illustrated in FIG. 3D, FIG. 3E, FIG. 4D, and FIG. 4E. As described above, the first embodiment enables the output signal that has been transmitted through the optical fiber to have a good optical waveform, and thus enables long distance transmission.

As described in FIG. 2, the saturated region 60 is a region where the light output intensity little changes even though the drive current is increased, and may be determined as a region between the maximum value of the light output intensity and the light output intensity that is 0.1 dB smaller than the maximum value. Therefore, the semiconductor optical amplifier 16 is preferably driven in a region in which the drive current is higher than the drive current that has a higher value between drive currents at which the light output intensity is 0.1 dB smaller than the maximum value of the light output intensity.

As illustrated in FIG. 4D, when the drive current is 180 mA, degradation of the eye-pattern of the optical waveform is suppressed, and the degradation of the eye-pattern is further suppressed when the drive current is 200 mA as illustrated in FIG. 4E. As illustrated in FIG. 2, the light output intensity is 10.8 dBm when a drive current of 180 mA is input to the semiconductor optical amplifier 16. That is to say, the light output intensity at a drive current of 180 mA is 0.4 dB smaller than the maximum value of the light output intensity. In the same manner, the light output intensity when a drive current of 200 mA is input to the semiconductor optical amplifier 16 is 10.5 dBm, which is 0.8 dB smaller than the maximum value of the light output intensity. Therefore, the semiconductor optical amplifier 16 is more preferably driven in a region in which the drive current is higher than the drive current at which the light output intensity is smaller than the maximum value of the light output intensity by 0.4 dB, and further preferably by 0.8 dB.

The first embodiment intensity-modulates the CW light beam emitted from the semiconductor laser 12 with the optical modulator 14, and amplifies the intensity-modulated light beam emitted from the optical modulator 14 with the semiconductor optical amplifier 16, but does not intend to any limitation. For example, the optical modulator 14 is not included, and the semiconductor laser 12 may emit the intensity-modulated light beam, and the semiconductor optical amplifier 16 may amplify the intensity-modulated light beam. In addition to amplifying the intensity-modulated light, the semiconductor optical amplifier 16 may amplify the CW light beam emitted from the semiconductor laser 12 that is a tunable semiconductor laser.

As illustrated in FIG. 1, the optical signal emitted from the laser chip 10 is preferably split into two optical signals, and one of the split signals is preferably received by the photo diode 40. The above described configuration enables to determine the drive current flowing into the semiconductor optical amplifier 16 easily. That is to say, the maximum value of the light output intensity and the saturated region 60 can be easily obtained by measuring the light output intensity with the photo diode 40 with increasing the drive current of the semiconductor optical amplifier 16 from 0 mA. Therefore, the region in which the drive current is higher than the drive current in the saturated region 60 can be easily obtained, and the drive current flowing into the semiconductor optical amplifier 16 can be easily determined.

[Second Embodiment]

Figure 6:
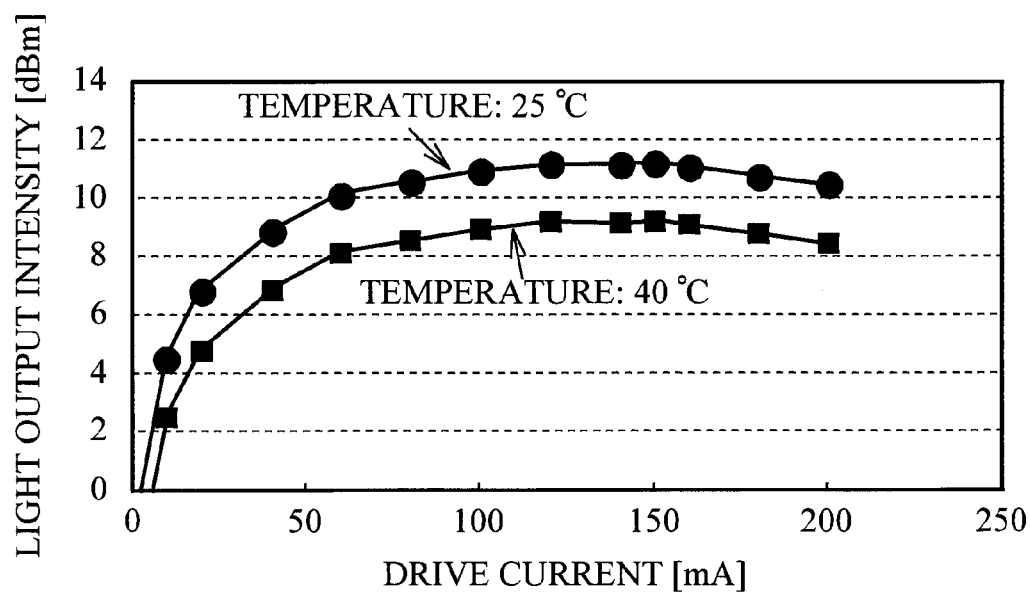
FIG. 6 is a diagram illustrating a relationship between drive current and light output intensity when a temperature of a semiconductor optical amplifier is changed.

A second embodiment describes a measuring method of the semiconductor optical amplifier 16. A description will be first given of a temperature dependence of output characteristics of the semiconductor optical amplifier 16. FIG. 6 is a diagram illustrating a relationship between drive current and light output intensity when the temperature of the semiconductor optical amplifier 16 is changed. In FIG. 6, the horizontal axis and the vertical axis are the same as those in FIG. 2, and thus the description is omitted. Circles represent a case where the temperature of the semiconductor optical amplifier 16 is 25° C., and rectangles represent a case where the temperature of the semiconductor optical amplifier 16 is 40° C. As illustrated in FIG. 6, when the temperature of the semiconductor optical amplifier 16 is 25° C. (indicated with circles), the light output intensity in the region in which the drive current exceeds the saturated region and the light output intensity decreases is approximately 10 to 11 dBm. On the other hand, when the temperature of the semiconductor optical amplifier 16 is 40° C. (indicated with rectangles), the light output intensity in the region in which the drive current exceeds the saturated region and the light output intensity decreases is approximately 8 to 9 dBm. As described above, when the temperature of the semiconductor optical amplifier 16 becomes higher, the light output intensity in the region in which the drive current exceeds the saturated region and the light output intensity decreases becomes smaller. This reveals that the light output intensity can be controlled so that a good optical waveform is obtained after the transmission through the optical fiber by changing the temperature of the semiconductor optical amplifier 16.

Figure 7:
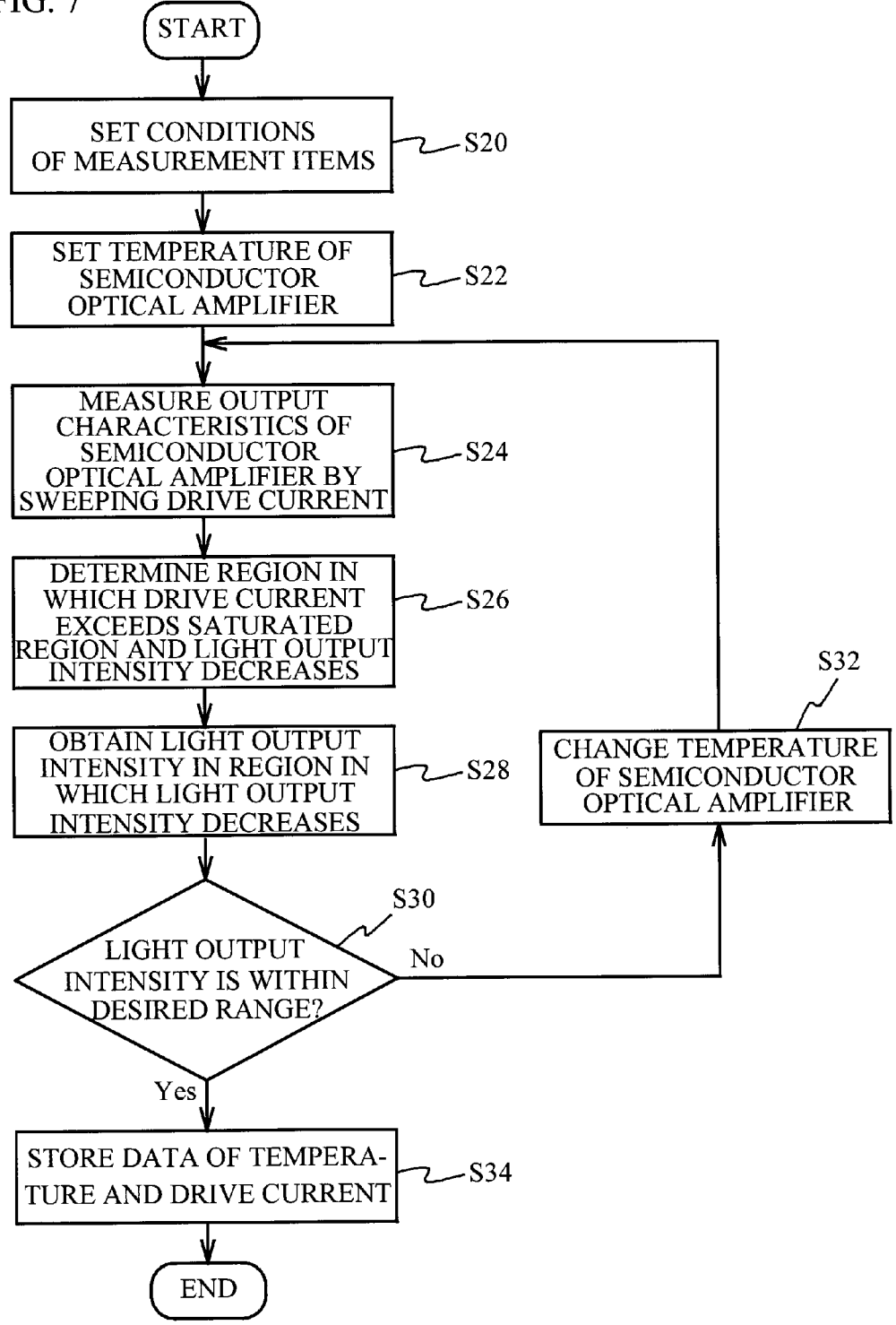
FIG. 7 is a flowchart for explaining a measuring method of the semiconductor optical amplifier.

FIG. 7 is a flowchart for explaining a measuring method of the semiconductor optical amplifier 16. As illustrated in FIG. 7, set is conditions of measurement items for measuring the semiconductor optical amplifier 16 (step S20). Conditions of measurement items are set so that the drive current of the semiconductor laser 12 is 150 mA and the voltage of the optical modulator 14 is 2 V. Then, the temperature of the semiconductor optical amplifier 16 is set by setting a temperature of the TEC 70 to an initial value (e.g. 25° C.) (step S22). Next, output characteristics of the semiconductor optical amplifier 16 is measured by sweeping the drive current flowing into the semiconductor optical amplifier 16 with keeping the light output intensity of the intensity-modulated light beam input into the semiconductor optical amplifier 16 constant (step S24). This process enables to obtain the output characteristics exhibiting the light output intensity with respect to the drive current when the temperature of the semiconductor optical amplifier 16 is 25° C., which is illustrated in FIG. 6, for example. Hereinafter, a description will be given of a case where the output characteristics of the semiconductor optical amplifier 16 is those illustrated in FIG. 6.

In the next step, from the output characteristics obtained at step S24, determined is a region in which the drive current exceeds the saturated region and the light output intensity decreases with increase in the drive current injected into the semiconductor optical amplifier 16 (step S26). This process allows the drive current in the region in which the drive current exceeds the saturated region and the light output intensity decreases to be obtained. Then, the light output intensity in the region in which the drive current exceeds the saturated region and the light output intensity decreases is obtained (step S28).

In the next step, it is determined whether the light output intensity obtained at step S28 is within a desired range (step S30). When the light output intensity is within the desired range (in the case of Yes), data of the temperature and drive current of the semiconductor optical amplifier 16 are stored in the memory 52 of the controller 50 (step S34). For example, assume that the desired range of the light output intensity is 10 to 12 dBm. According to FIG. 6, when the temperature of the semiconductor optical amplifier 16 is 25° C., the light output intensity in the region in which the drive current exceeds the saturated region and the light output intensity decreases is 10 to 11 dBm, and thus is within the desired range. Therefore, in such a case, the determination of step S30 becomes Yes, and the data of the temperature and drive current of the semiconductor optical amplifier 16 are stored in the memory 52 (step S34).

In step S30, when the light output intensity obtained in step S28 is out of the desired range (in the case of No), the temperature of the TEC 70 is changed to change the temperature of the semiconductor optical amplifier 16 (step S32). The temperature is changed based on a changing amount (e.g. 5° C.) preliminarily determined. Here, as described in FIG. 6, when the temperature of the semiconductor optical amplifier 16 becomes higher, the light output intensity in the region in which the drive current exceeds the saturated region and the light output intensity decreases becomes smaller. Therefore, when the light output intensity obtained in step S28 is greater than the desired range, the temperature of the TEC 70 is increased to raise the temperature of the semiconductor optical amplifier 16. On the other hand, when the light output intensity is smaller than the desired range, the temperature of the TEC 70 is decreased to lower the temperature of the semiconductor optical amplifier 16. For example, assume that the desired range of the light output intensity is 8 to 10 dBm. According to FIG. 6, when the temperature of the semiconductor optical amplifier 16 is 25° C., the light output intensity in the region in which the drive current exceeds the saturated region and the light output intensity decreases is 10 to 11 dBm, and thus is greater than the desired range. Therefore, the light output intensity is out of the desired range (step S30/No), and accordingly the temperature of the semiconductor optical amplifier 16 is raised in step S32.

After the temperature of the semiconductor optical amplifier 16 is changed in step S32, processes from step S24 to step S30 are executed again. The processes from step S24 to step S32 are repeated until the light output intensity becomes within the desired range. When the light output intensity becomes within the desired range (step S30/Yes), the data of the temperature and drive current of the semiconductor optical amplifier 16 are stored in the memory 52 of the controller 50 (step S34). For example, assume that the desired range of the light output intensity is 8 to 10 dBm. According to FIG. 6, the light output intensity in the region in which the drive current exceeds the saturated region and the light output intensity decreases becomes 8 to 9 dBm when the temperature of the semiconductor optical amplifier 16 becomes 40° C. Therefore, when the processes from the step S24 to step S32 are repeated until the temperature of the semiconductor optical amplifier 16 becomes 40° C., the light output intensity becomes within the desired range (step S30/Yes), and the data of the temperature and drive current of the semiconductor optical amplifier 16 are stored in the memory 52 (step S34).

These processes enable to determine the conditions with which the light output intensity in the region in which the drive current exceeds the saturated region and the light output intensity decreases is within the desired region. Therefore, a good optical waveform can be obtained and the light output intensity having a desired magnitude can be obtained by storing these conditions in the memory 52 of the controller 50, and driving the semiconductor optical amplifier 16 in accordance with these conditions by the controller 50.

As illustrated in FIG. 6, the light output intensity of the light beam in the region in which the drive current exceeds the saturated region and the light output intensity decreases becomes smaller by raising the temperature of the semiconductor optical amplifier 16. Therefore, at the step where the temperature of the semiconductor optical amplifier 16 is changed, when the light output intensity in the region in which the light output intensity decreases is greater than the desired range, the temperature of the semiconductor optical amplifier 16 is preferably raised, and when the light output intensity is smaller than the desired range, the temperature of the semiconductor optical amplifier 16 is preferably lowered.

The present invention is not limited to the specifically disclosed embodiments and variations but may include other embodiments and variations without departing from the scope of the present invention.

What is claimed is:

1. A control method of a semiconductor optical amplifier comprising:
   controlling a driving current of the semiconductor optical amplifier,
   wherein a drive current of the semiconductor optical amplifier includes a first drive current range and a second drive current range, the drive current in the first drive current range is higher than that in the second drive current range, a light output intensity of the semiconductor optical amplifier in the first drive current range decreases in accordance with increasing of the driving current and the light output intensity in the second drive current range increases in accordance with increasing of the driving current,
   in the controlling the driving current, the driving current is controlled in the first drive current range.

2. The control method according to claim 1, wherein
   the drive current of the semiconductor optical amplifier includes a third drive current range in which the drive current is lower than that in the first drive current range and higher than that in the second drive current range and the light output intensity reaches saturation with respect to increasing of the driving current.

3. The control method according to claim 1, wherein
   the light output intensity of the semiconductor optical amplifier is 0.4 dB or more smaller than a peak of the light output intensity of the semiconductor optical amplifier.

4. The control method according to claim 1, wherein
   a light source of the semiconductor optical amplifier is intensity-modulated light beam.

5. The control method according to claim 1, wherein
   the driving current is feedback-controlled to a target value of a light output intensity of the semiconductor optical amplifier based on the light output of the semiconductor optical amplifier.

6. The control method according to claim 1, wherein
   a temperature of the semiconductor optical amplifier is controlled to a target value that achieves a target value of a light output intensity of the semiconductor optical amplifier.

7. The control method according to claim 1, wherein
   the semiconductor optical amplifier is integrated with a semiconductor laser and a semiconductor optical modulation element.

8. A semiconductor optical amplifier device comprising:
   a semiconductor optical amplifier; and
   a controller that controls a driving current of the semiconductor optical amplifier
   wherein a drive current of the semiconductor optical amplifier includes a first drive current range and a second drive current range, the drive current in the first drive current range is higher than that in the second drive current range, a light output intensity of the semiconductor optical amplifier in the first drive current range decreases in accordance with increasing of the driving current and the light output intensity in the second drive current range increases in accordance with increasing of the driving current,
   the controller controls the driving current in the first drive current range.

9. The semiconductor optical amplifier device according to claim 8, wherein
   the drive current of the semiconductor optical amplifier includes a third drive current range in which the drive current is lower than that in the first drive current range and higher than that in the second drive current range and the light output intensity reaches saturation with respect to increasing of the driving current.

10. The semiconductor optical amplifier device according to claim 8, wherein
    the light output intensity of the semiconductor optical amplifier is 0.4 dB or more smaller than a peak of the light output intensity of the semiconductor optical amplifier.

11. The semiconductor optical amplifier device according to claim 8, wherein
    a light source of the semiconductor optical amplifier is intensity-modulated light beam.

12. The semiconductor optical amplifier device according to claim 8, further comprising
    a light receiving element receives a light output of the semiconductor optical amplifier device.

13. The semiconductor optical amplifier device according to claim 12, wherein
    the driving current is feedback-controlled to a target value of a light output intensity of the semiconductor optical amplifier based on an output of the light receiving element.

14. The semiconductor optical amplifier device according to claim 8, wherein
    a temperature of the semiconductor optical amplifier is controlled to a target value that achieves a target value of a light output intensity of the semiconductor optical amplifier.

15. The semiconductor optical amplifier device according to claim 8, wherein
    the semiconductor optical amplifier is integrated with a semiconductor laser and a semiconductor optical modulation element.

16. A measuring method of characteristics of a semiconductor optical amplifier comprising:
    first step of setting a temperature of the semiconductor optical amplifier to a first value;
    second step of measuring a light output intensity of the semiconductor optical amplifier by controlling a driving current of the semiconductor optical amplifier;
    third step of setting the temperature to a second value different from the first value; and
    fourth step of repeating the second step,
    wherein a drive current of the semiconductor optical amplifier includes a first drive current range and a second drive current range, the drive current in the first drive current range is higher than that in the second drive current range, a light output intensity of the semiconductor optical amplifier in the first drive current range decreases in accordance with increasing of the driving current and the light output intensity in the second drive current range increases in accordance with increasing of the driving current, in the second step, the driving current is controlled in the first driving current range.

17. The measuring method according to claim 16, wherein the second value is higher than the first value when the light output intensity of the semiconductor optical amplifier greater than a target value in the first step, and the second value is lower than the first value when the light output intensity of the semiconductor optical amplifier smaller than the target value in the first step.

\* \* \* \* \*